United States Patent
Chu (10) Patent No.: US 12,224,724 B2
(45) Date of Patent: Feb. 11, 2025

(54) LOCAL COMMON MODE FEEDBACK RESISTOR-BASED AMPLIFIER WITH OVERSHOOT MITIGATION

(71) Applicant: Micron Technology, Inc., Boise, ID (US)

(72) Inventor: Wei Lu Chu, Pudong (CN)

(73) Assignee: Micron Technology, Inc., Boise, ID (US)

( * ) Notice: Subject to any disclaimer, the term of this patent is extended or adjusted under 35 U.S.C. 154(b) by 819 days.

(21) Appl. No.: 17/377,148

(22) Filed: Jul. 15, 2021

(65) Prior Publication Data

US 2023/0014458 A1    Jan. 19, 2023

(51) Int. Cl.
*H03F 3/45* (2006.01)

(52) U.S. Cl.
CPC ... *H03F 3/45269* (2013.01); *H03F 2200/426* (2013.01)

(58) Field of Classification Search
CPC .............................. H03F 3/45269; H03F 3/45
USPC ......................................................... 330/253
See application file for complete search history.

(56) References Cited

U.S. PATENT DOCUMENTS

| | | | | |
|---|---|---|---|---|
| 4,586,155 | A * | 4/1986 | Gilbert | G06G 7/163 708/835 |
| 7,443,240 | B2 * | 10/2008 | Katsunaga | H03G 1/007 330/261 |
| 2005/0134382 | A1 * | 6/2005 | Anderson | H03F 3/45183 330/259 |
| 2007/0180281 | A1 * | 8/2007 | Partovi | G06F 13/4072 713/320 |
| 2010/0308933 | A1 * | 12/2010 | See | H03F 3/72 333/32 |
| 2011/0304394 | A1 * | 12/2011 | Bult | H03F 3/24 330/253 |
| 2019/0090066 | A1 * | 3/2019 | Polo | H04R 3/00 |
| 2022/0216839 | A1 * | 7/2022 | Nishimura | H03F 3/2173 |

* cited by examiner

*Primary Examiner* — Patricia T Nguyen
(74) *Attorney, Agent, or Firm* — Fletcher Yoder, P.C.

(57) ABSTRACT

An amplifier may include multiple transistors with two transistors having their gates tied together via a common connection. The amplifier may utilize a local common mode feedback resistor as part of the amplifier. The local common mode feedback resistor may be coupled between the common connection and respective terminals of two transistors of multiple transistors. The local common mode feedback resistor may include a group of resistors coupled in series. The local common mode feedback resistor may also include a metal oxide semiconductor (MOS) resistor coupled in parallel with one or more of the first group of resistors. In the local common mode feedback, the first MOS resistor provides different levels of resistance to different process corners to reduce overshoot when the amplifier is enabled.

24 Claims, 5 Drawing Sheets

LOCAL COMMON MODE FEEDBACK RESISTOR-BASED AMPLIFIER WITH OVERSHOOT MITIGATION

BACKGROUND

Field of the Present Disclosure

Embodiments of the present disclosure relate generally to amplifiers in semiconductor devices. Specifically, the embodiments pertain to local common mode feedback resistor-based amplifiers that may be used to provide amplification. For example, the local common mode feedback resistor-based amplifier may include an operational transconductance amplifier (OTA).

Description of Related Art

Power amplifiers may be utilized in semiconductor devices. For instance, OTA amplifiers may use a local common mode feedback (LCMF) amplifier scheme to provide relatively fast speeds compared to other amplifier schemes while utilizing relatively less current than other amplifier schemes. However, LCMF amplifiers may be susceptible to overshoot compared to other amplifier schemes. The overshoot is mainly caused by the large gain via the LCMF amplifier after the LCMF amplifier is enabled. The overshoot may be directly proportional to a size of the LCMF resistance. This overshoot may cause the semiconductor device to function other than intended. Specifically, the overshoot can cause reliability issues. For instance, if the LCMF-based amplifier is used to provide a voltage (Vary) to a memory array, the overshoot may increase the response time before returning to a normal level. Additionally, this longer response time may cause an array margin loss that may cause lower yield and/or increased costs of production in the manufacturing of the power amplifiers and/or memory devices incorporating the power amplifiers.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, LCMF-based amplifiers may be susceptible to voltage overshoot. To address this issue, at least some resistors in a LCMF may be arranged in parallel to a metal oxide semiconductor (MOS) resistor that is made of a positive-channel MOS (PMOS) and a negative-channel MOS (NMOS). The MOS resistor being arranged in parallel with the resistors is used to dynamically tune the amplifier gain across different process corners to reduce overshoot of the amplifier output. In other words, the MOS resistor may reduce the equivalent resistance for gain at high gain process corners to reduce the overshoot. For instance, the overshoot may be reduced to a lower value (e.g., 30 mV) from a higher value (e.g., 160 mV) that may occur without the MOS resistor while maintaining the fast response and low current benefits of the LCMF-based amplifier for lower gain process corners.

Figure 1:
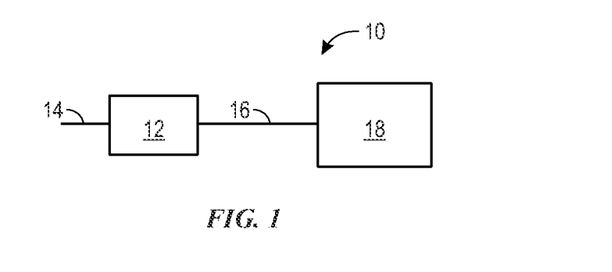
FIG. 1 is a simplified block diagram illustrating an electronic device having one or more power amplifiers, according to an embodiment of the present disclosure.

Turning now to the figures, FIG. 1 is a simplified block diagram illustrating certain features of an electronic device 10 having one or more power amplifiers 12. Specifically, the block diagram of FIG. 1 is a functional block diagram illustrating only certain functionality of the electronic device 10. The power amplifiers 12 amplify signals/voltages/currents to a desired amplified level. In accordance with one embodiment, the electronic device 10 may be a double data rate type five synchronous dynamic random access memory (DDR5 SDRAM) device or a double data rate type four synchronous dynamic random access memory (DDR4 SDRAM). Additionally or alternatively, the electronic device 10 may include any type of electronic device that includes the one or more power amplifiers 12. The one or more power amplifiers 12 receive an input power level 14 (e.g., voltage and/or current) and output an amplified power level 16 that is transmitted to target circuitry 18 that utilizes the amplified power level 16. The target circuitry 18 may include any circuitry in the electronic device 10 that performs one or more functions using the amplified power level 16. For example, the amplified power level 16 may include an array voltage provided to the target circuitry 18 as a memory array of the electronic device 10. Furthermore, the amplified power level 16 may be delivered using a power bus. For instance, the array voltage may be provided to the memory array via an array voltage bus.

Figure 2:
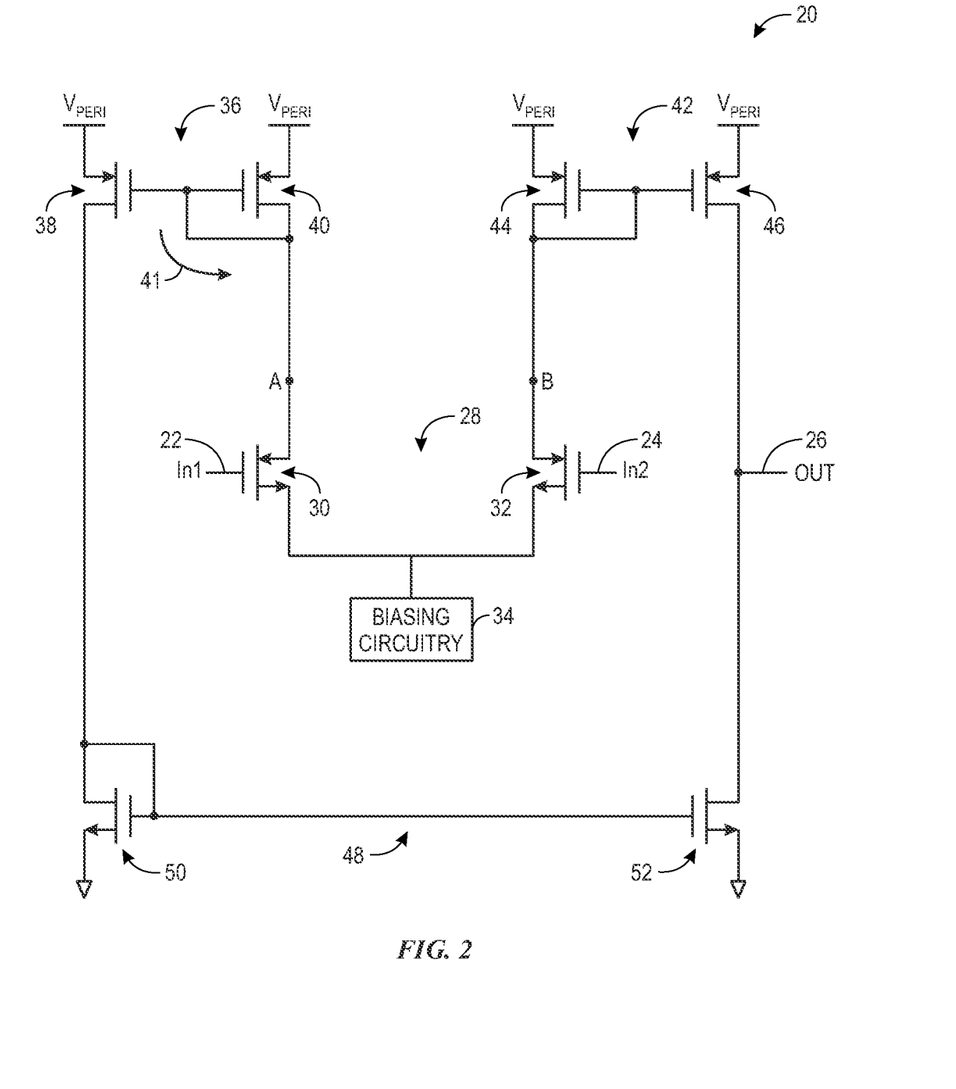
FIG. 2 is a circuit diagram of an operational transconductance amplifier (OTA) as an embodiment of a power amplifier of the electronic device of FIG. 1, according to an embodiment of the present disclosure.

FIG. 2 is a circuit diagram of an operational transconductance amplifier (OTA) 20 that may be implemented as one of the power amplifiers 12 in the electronic device 10. Although the OTA 20 is illustrated, the power amplifier(s) 12 may be implemented using any suitable amplifier scheme. As illustrated, the OTA 20 receives inputs 22 and 24 (In1 and In2) and outputs an OTA output 26 (Out). For instance, the inputs 22 and 24 may be opposite polarities (e.g., differential inputs). The inputs 22 and 24 are input to a transistor pair 28 that includes a first transistor 30 that receives the input 22 at a gate of the first transistor 30 and a second transistor 32 that receives the input 24 at a gate of the second transistor 32. The first transistor 30 and the second transistor 32 may both be NMOS transistors, as illustrated. The transistor pair 28 is also coupled to biasing circuitry 34 via sources of the respective transistors. The biasing circuitry 34 provides bias voltages to the transistor pair 28 used in the OTA 20. The drain of the first transistor 30 is coupled to node A, and the drain of the second transistor 32 is coupled to node B.

A current mirror 36 is coupled to node A. The current mirror 36 includes a transistor 38 that has a source coupled to a voltage supply (e.g., $V_{PERI}$) and a gate coupled to a transistor 40. The gates of the transistors 38 and 40 are both tied to the drain of the transistor 40. With the gate and drain of the transistor 40 tied together, the transistor 40 acts like a diode connection along path 41. Furthermore, since this diode connection has negligible resistance, little to no amplification occurs via the transistor 40. Furthermore, the transistors 38 and 40 may be sized relatively the same thereby causing a 1:1 ratio between the currents through the transistors 38 and 40.

A current mirror 42 is coupled to node B. The current mirror 42 includes a transistor 46 that has a source coupled to a voltage supply (e.g., $V_{PERI}$) and a gate coupled to a transistor 44. The gates of the transistors 46 and 44 are both tied to the drain of the transistor 44. With the gate and drain of the transistor 44 tied together, the transistor 44 acts like a diode connection similar to the transistor 42. Furthermore, the transistors 46 and 44 may be sized relatively the same thereby causing a 1:1 ratio between the currents through the transistors 46 and 44.

The drains of transistors 38 and 46 are both coupled to legs of a current mirror 48. The current mirror 48 includes transistor 50 that has its gate and drain coupled to drain of the transistors 38. The current mirror 48 also includes transistor 52 that has its drain coupled to the drain of the transistor 46 and its gate coupled to the gate of the transistor 50. The sources of the transistors 50 and 52 are coupled to ground. The transistors 50 and 52 may have sizes that are approximately equal, thereby causing the currents through the transistors 50 and 52 to be approximately equal.

Figure 3:
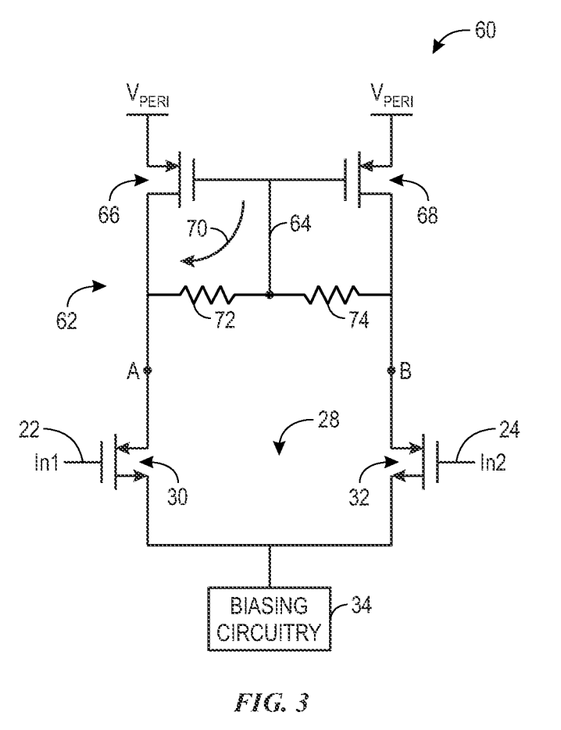
FIG. 3 is a circuit diagram of a portion of an alternative embodiment of the OTA of FIG. 2 having a local common mode feedback (LCMF), according to an embodiment of the present disclosure.

To enhance amplification in the OTA 20, at least part of the OTA 20 may be replaced with a local command mode feedback (LCMF). For instance, FIG. 3 shows a portion 60 of an OTA similar to the OTA 20. The portion 60 includes an LCMF 62 coupled to the transistor pair 28 via Nodes A and B. The LCMF 62 utilizes a common connection 64 between gates of transistors 66 and 68. The transistors 66 and 68 may include PMOS transistors with sources tied to voltage supplies (e.g., $V_{PERI}$). The drain of the transistor 66 is coupled to the common connection 64 via a resistor 72, and the drain of the transistor 68 is coupled to the common connection 64 via a resistor 74. Since the respective gates and drains of the transistors 66 and 68 are tied together via respective resistors 72 and 74, the connections are functionally equivalent to a diode with resistance. For instance, connection 70 may be equivalent to a diode plus resistance. This resistance enables the power amplifier 12 to provide a larger gain due to the LCMF 62.

Figure 4:
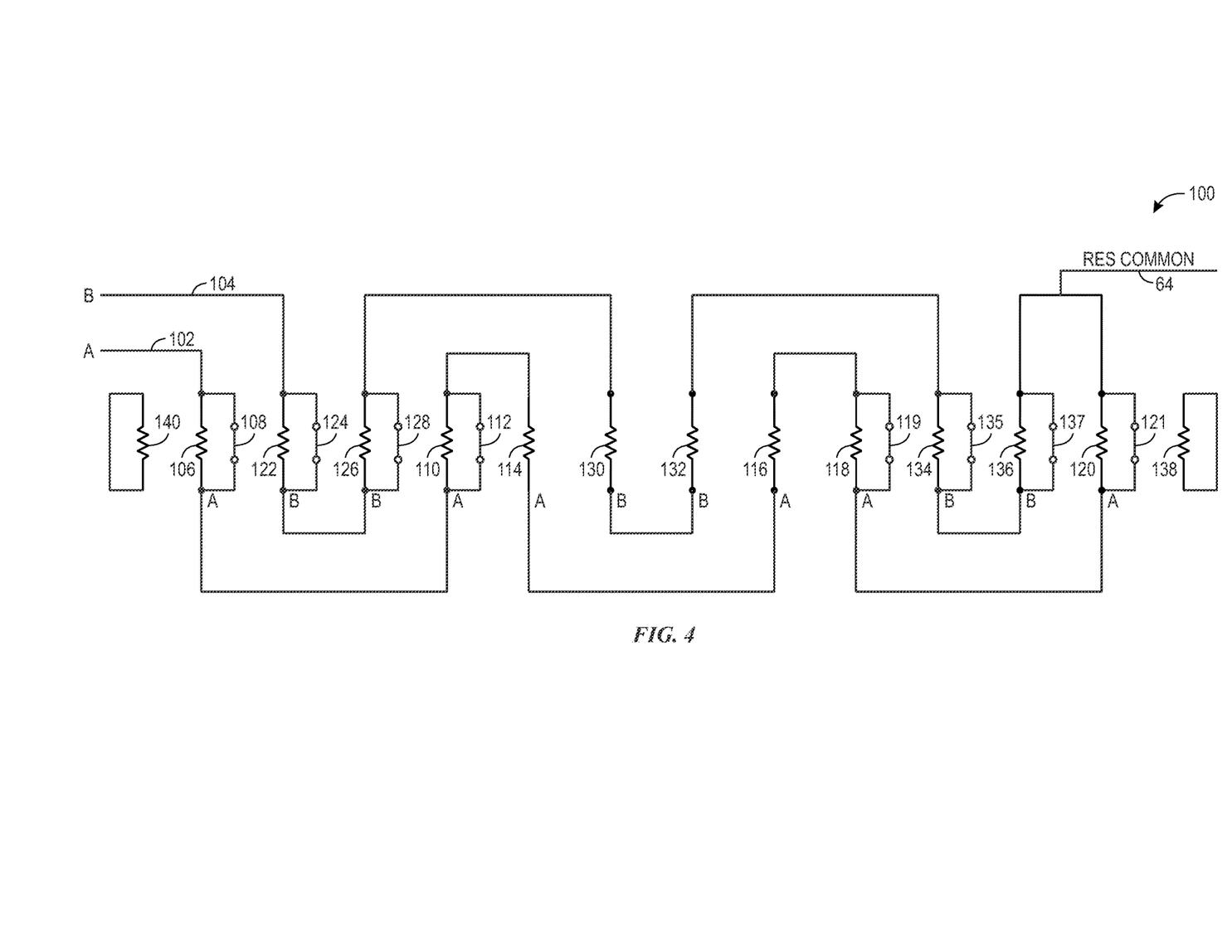
FIG. 4 is a circuit diagram of an embodiment of the LCMF of FIG. 3, according to an embodiment of the present disclosure.

FIG. 4 is a schematic diagram of an embodiment of an LCMF resistor 100 that may be used to implement the resistors 72 and 74. As illustrated, the LCMF resistor 100 is coupled to the Node A via an input 102 and coupled to the Node B via an input 104. The LCMF resistor 100 is also coupled to the common connection 64. The LCMF resistor 100 is illustrated in a common centroid layout.

The input 102 is coupled to a resistor 106 that may be selectively bypassed with a switch 108. The resistor 106, when optioned in using the switch 108, is coupled in series to a resistor 110 as long as the resistor is not bypassed via a switch 112. The resistor 110, when optioned in using the switch 112, is coupled in series with resistors 114, 116, 118, and 120. The resistor 118 may be bypassed using a switch 119, and the resistor 120 may be bypassed using a switch 121. The resistor 120 and/or the switch 121 are coupled to the common connection 64. In summary, the amount of resistance between the input 102 and the common connection 64 may be adjusted by dynamically bypassing the resistor 106 via the switch 108, dynamically bypassing the resistor 110 via the switch 112, dynamically bypassing the resistor 118 via the switch 119, and/or dynamically bypassing the resistor 120 via the switch 121. Accordingly, the resistors 106, 110, 114, 116, 118, and 120 may be used to implement the resistor 72 while providing flexibility of various resistances via the switches 108, 112, 119, and 121. In some embodiments, the resistors 106, 110, 114, 116, 118, and 120 may each have a common resistance unit (e.g., 20 kΩ or 12 kΩ). In such embodiments, the maximum resistance when no resistors are bypassed may be 6× (e.g., 120 kΩ) of the unit resistance (e.g., 20 kΩ). The minimum resistance when resistors 106, 110, 118, and 120 are bypassed is 2× (e.g., 40 kΩ) of the unit resistance (e.g., 20 kΩ). A default value (e.g., 80 kΩ) may include bypassing some (e.g., 2 resistors) while not bypassing others (e.g., 4 resistors).

The input 104 is coupled to a resistor 122 that may be selectively bypassed with a switch 124. The resistor 122, when optioned in using the switch 124, is coupled in series to a resistor 126 as long as the resistor is not bypassed via a switch 128. The resistor 126, when optioned in using the switch 128, is coupled in series with resistors 130, 132, 134, and 136. The resistor 134 may be bypassed using a switch 135, and the resistor 136 may be bypassed using a switch 137. The resistor 136 and/or the switch 137 are coupled to the common connection 64. In summary, the amount of resistance between the input 104 and the common connection 64 may be adjusted by dynamically bypassing the resistor 122 via the switch 124, dynamically bypassing the resistor 126 via the switch 128, dynamically bypassing the resistor 134 via the switch 135, and/or dynamically bypassing the resistor 136 via the switch 137. Accordingly, the resistors 122, 126, 130, 132, 134, and 136 may be used to implement the resistor 74 while providing flexibility of various resistances via the switches 124, 128, 133, and 135. In some embodiments, the resistors 122, 126, 130, 132, 134, and 136 may each have a common resistance unit (e.g., 20 kΩ or 12 kΩ). In such embodiments, the maximum resistance when no resistors are bypassed may be 6× (e.g., 120 kΩ) of the unit resistance (e.g., 20 kΩ). The minimum resistance when resistors 106, 110, 118, and 120 are bypassed is 2× (e.g., 40 kΩ) of the unit resistance (e.g., 20 kΩ). A default value (e.g., 80 kΩ) may include bypassing some (e.g., 2 resistors) while not bypassing others (e.g., 4 resistors).

The LCMF resistor 100 may include 1 or more dummy resistors. For instance, an embodiment of the LCMF resistor 100 includes a first dummy resistor 138 and a second dummy resistor 140. Dummy resistors may be used in testing, used for electromagnetic (EM) isolation, or other situations. In some embodiments the dummy resistors may be omitted from the LCMF resistor 100.

Figure 5:
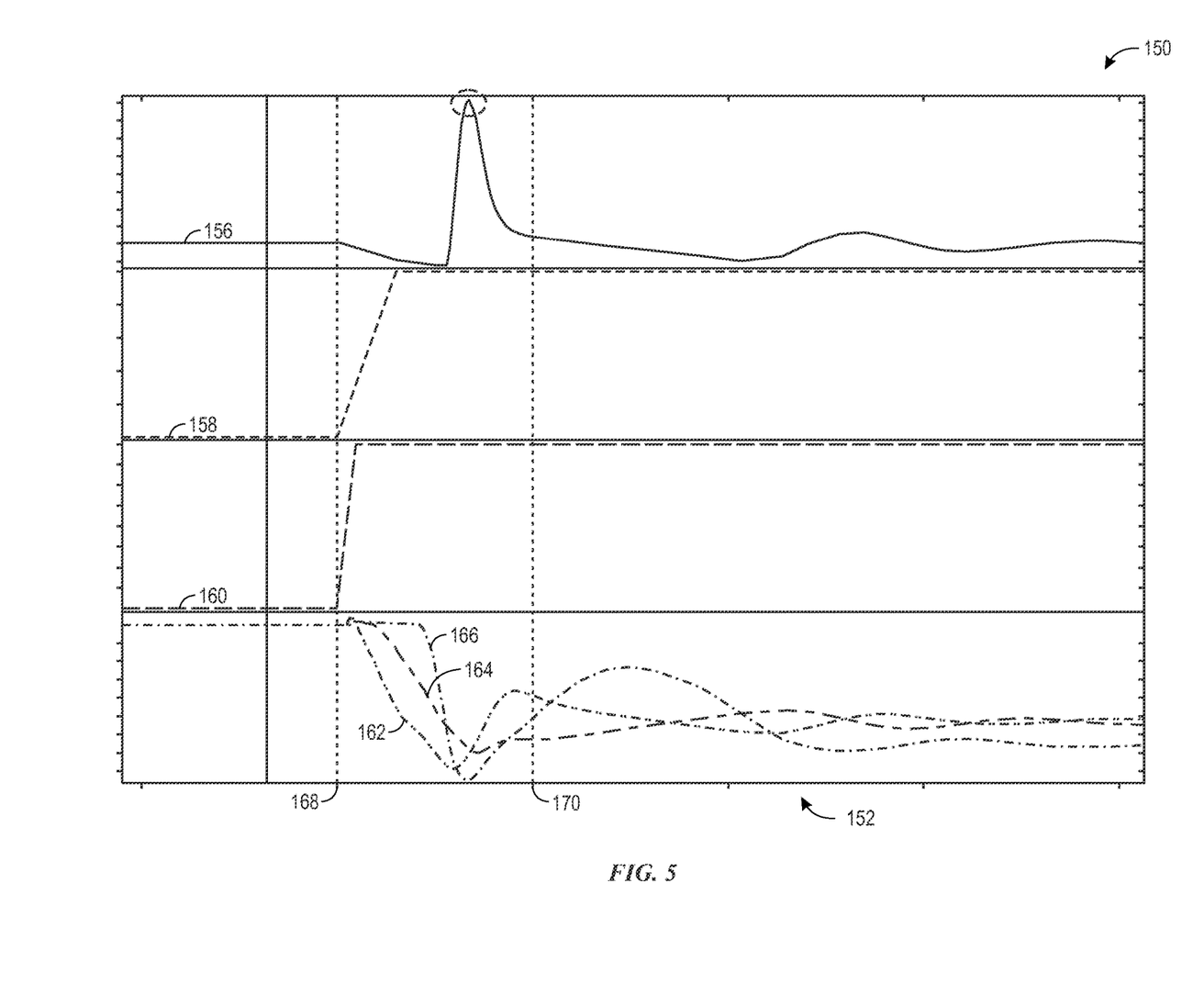
FIG. 5 is a graph of an enable of the amplifier of FIG. 2 having the LCMF of FIG. 3 that causes an overshoot, according to an embodiment of the present disclosure.

FIG. 5 is a graph 150 of voltages and currents in the OTA 20 and LCMF before, during, and after the OTA 20 is enabled over time 152. The graph 150 includes a line 156 that corresponds to a voltage level for the amplifier. The graph 150 also includes a line 158 that corresponds to a current input to/output from the amplifier. The graph 150 also includes a line 160 that corresponds to a voltage of an amplify enable signal used to enable amplification via the OTA 20. The graph 150 also includes a line 162 that corresponds to a voltage at the Node A, a line 164 that corresponds to a voltage at the Node B, and a line 166 that corresponds to a voltage at the Node B, and a line 166 that corresponds to a voltage at the OTA output 26.

At time 168, the amplifier is enabled via a pulse of the amplifier enable signal corresponding to the line 160. At time 170, after the pulse, the lines 156, 162, 164, and 166 show corresponding changes with rapid slopes resulting in an overshoot 172 of the voltage output by the amplifier. Specifically, the lines 162 and 164 show sinks at the respective Nodes A and B. The overshoot 172 may be due to large gain of the amplifier and the large PMOSes used in the amplifier in response to loading/demand pull downs on the PMOS(es).

In some implementations, the overshoot 172 may be relatively large. For example, the overshoot 172 may be 160 mV to a total voltage of 1.12V. The amount of voltage overshot in the overshoot 172 is proportional to the amount of resistance in the LCMF. A smaller LCMF resistance causes a smaller overshoot. However, the smaller LCMF resistance also causes a smaller gain. Additionally, the smaller LCMF resistance causes a larger current. This overshoot 172 is more pronounced for amplifiers with high gain (e.g., fast FF) process corners than for lower gain (e.g., SS or TT) process corners. Furthermore, the overshoot is related to a step response/pulse while the overshoot does not occur in a continuous response.

Figure 6:
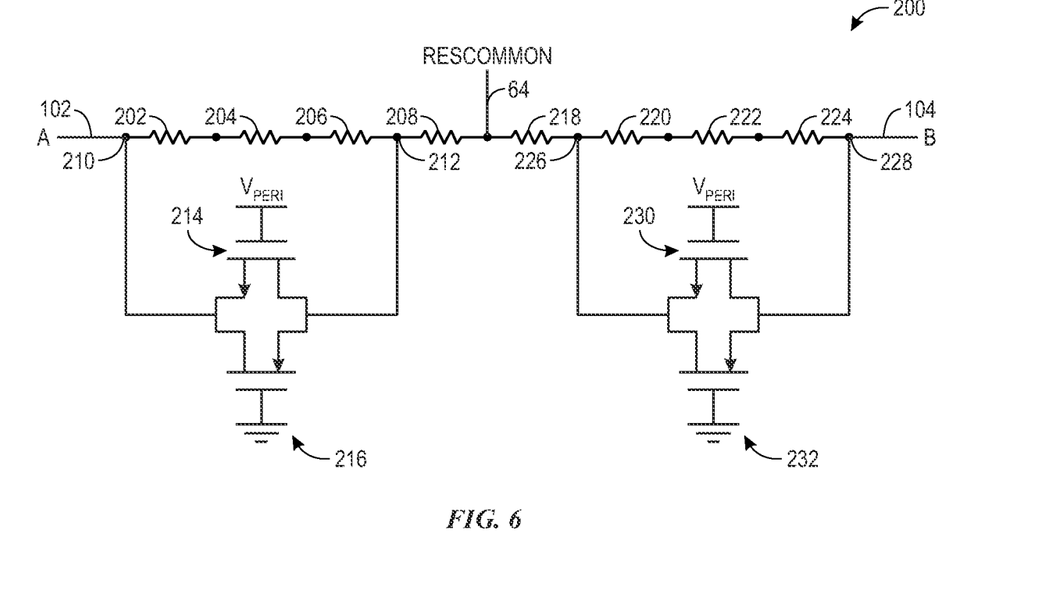
FIG. 6 is a circuit diagram of an alternative embodiment of the LCMF that reduces/eliminates overshoot using the OTA implemented using an OTA, according to an embodiment of the present disclosure.

To address such potential for overshoots, the LCMF resistor 100 may be enhanced/replaced with an LCMF resistor that utilizes a MOS resistor that selectively bypasses resistances for high gain process corners while not bypassing the same resistances for low gain process corners. FIG. 6 illustrates an LCMF resistor 200 that may be used to mitigate and/or eliminate overshoot in the LCMF-based amplifier. As illustrated, the LCMF resistor 200 is coupled to the Node A via the input 102. The input 102 is coupled to resistors 202, 204, and 206 in series. The resistor 206 may be coupled to a resistor 208 that is coupled between the resistor 206 and the common connection 64.

The LCMF resistor 200 also includes a MOS resistor 216, also referred to as a pass gate, which is coupled in parallel with the resistors 202, 204, and 206 between nodes 210 and 212. In other words, the MOS resistor 216 may be used to bypass a portion (e.g., resistors 202, 204, and 206) of the string of resistors in the LCMF resistor 200. The MOS resistor 216 includes a transistor 214 that has its gate coupled to a voltage supply (e.g., $V_{PERI}$), its source coupled to the node 210, and its drain coupled to the node 212. As illustrated, the transistor 214 may be an NMOS transistor but may include any other suitable transistor type. The MOS resistor 216 also includes a transistor 217 that has its gate coupled to ground, its drain coupled to the node 210, and its source coupled to the node 212. As illustrated, the transistor 217 may be a PMOS transistor but may include any other suitable transistor type.

The MOS resistor 216 is process dependent with the amount of resistance provided via the MOS resistor 216 dependent upon the process corner applied to the MOS resistor 216. For example, at a fast FF process corner, the resistance through the MOS resistor 216 provides a lower resistance path between the nodes 210 and 212 through the MOS resistor 216 to effectively bypass the resistors 202, 204, and 206. With the lower resistance path, the LCMF resistor 200 provides a lower level of gain than if the path through the resistors 202, 204, and 206 were used.

For a slow SS process corner, the resistance through the MOS resistor 216 is relatively high causing the lower resistance path between the nodes 210 and 212 to be through the resistors 202, 204, and 206 rather than through the MOS resistor 216. This routing through the resistors 202, 204, and 206 increases effective resistance between nodes 210 and 212 relative to the fast FF corner. By increasing the effective resistance, the slow SS process corner experiences more gain than the slow SS corner. For intermediate TT process corners, the path through the resistors 202, 204, and 206 and through the MOS resistor 216 may be substantially similar and may provide the least resistance between the nodes 210 and 212 through the resistors 202, 204, and 206 and/or through the MOS resistor 216.

As illustrated, the LCMF resistor 200 is coupled to the Node B via the input 104. The input 104 is coupled to resistors 218, 220, and 222 in series. The resistor 222 may be coupled to a resistor 224 that is coupled between the resistor 222 and the common connection 64.

The LCMF resistor 200 also includes a MOS resistor 232, which is similar to the MOS resistor 216 and is also referred to as a pass gate. The MOS resistor 232 is coupled in parallel with the resistors 218, 220, and 222 between nodes 226 and 228. The MOS resistor 232 includes a transistor 230 that has its gate coupled to a voltage supply (e.g., $V_{PERI}$), its source is coupled to the node 226, and its drain is coupled to the node 228. As illustrated, the transistor 230 may be an NMOS transistor but may include any other suitable transistor type. The MOS resistor 232 also includes a transistor 234 that has its gate coupled to ground, its drain coupled to the node 226, and its source coupled to the node 228. As illustrated, the transistor 234 may be a PMOS transistor but may include any other suitable transistor type.

The MOS resistor 232 is process dependent with the amount of resistance provided via the MOS resistor 232 depending on the process corner being applied to the MOS resistor 232. For example, at a fast FF process corner, the resistance through the MOS resistor 232 provides a lower resistance path between the nodes 226 and 228 through the MOS resistor 232 to effectively bypass the resistors 218, 220, and 222. With the lower resistance path, the LCMF resistor 200 provides a lower level of gain than if the path through the resistors 218, 220, and 222 were used.

For a slow SS process corner, the resistance through the MOS resistor 232 is relatively high causing the lower resistance path between the nodes 226 and 228 to be through the resistors 218, 220, and 222 rather than through the MOS resistor 232. This routing through the resistors 218, 220, and 222 increases effective resistance between nodes 226 and 228 relative to the fast FF corner. By increasing the effective resistance, the slow SS process corner experiences more gain than the slow SS corner. For intermediate TT process corners, the path through the resistors 218, 220, and 222 and through the MOS resistor 232 may be substantially similar and may provide the least resistance between the nodes 226 and 228 through the resistors 218, 220, and 222 and/or through the MOS resistor 232.

Since the fast FF process corner is more susceptible to overshoot than slower process corners (e.g., TT and SS), this reduction of gain reduces gain only where it is most likely to cause overshoot while maintaining a higher gain for the slower process corners that are less susceptible to overshoot.

In some embodiments, the resistors 202, 204, 206, 208, 218, 220, 222, and 224 may each have the same resistance unit. In certain embodiments, the MOS resistors 216 and 232 may be used to bypass at least 1 resistor in the LCMF resistor 100 implemented using a common centroid layout.

Although the foregoing discusses various logic-low and/or logic-high assertion polarities, at least some of these polarities may be inverted in some embodiments. While the present disclosure may be susceptible to various modifications and alternative forms, specific embodiments have been shown by way of example in the drawings and have been described in detail herein. For instance, PMOS and NMOS transistors may be swapped and polarities of voltages may be reversed. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An amplifier, comprising:
   a plurality of transistors, wherein a respective gate terminal of each of two transistors of the plurality of transistors are tied together via a common connection; and
   a local common mode feedback resistor coupled between the common connection and respective terminals of the two transistors, wherein the local common mode feedback resistor comprises:
      a first plurality of resistors coupled in series between the common connection and the respective terminal of a first of the two transistors; and
      a first metal oxide semiconductor (MOS) resistor coupled in parallel with one or more of the first plurality of resistors, wherein the first MOS resistor provides different levels of resistance to different process corners.

2. The amplifier of claim 1, wherein the respective terminals of the two transistors comprise drain terminals of the two transistors.

3. The amplifier of claim 1, wherein the first MOS resistor comprises:
   a first transistor, wherein a gate terminal of the first transistor is coupled to a voltage supply, a source terminal of the first transistor is coupled to a first node coupled to a first end of the one or more of the first plurality of resistors, and a drain terminal of the first transistor is coupled to a second node coupled to a second end of the one or more of the first plurality of resistors; and
   a second transistor, wherein a gate terminal of the second transistor is coupled to ground, a source terminal of the second transistor is coupled to the second node, and a drain terminal of the second transistor is coupled to the first node.

4. The amplifier of claim 3, wherein the first transistor comprises an n-channel MOS transistor, and the second transistor comprises a p-channel MOS transistor.

5. The amplifier of claim 1, wherein the local common mode feedback resistor comprises:
   a second plurality of resistors between the common connection and the respective terminal of a second of the two transistors; and
   a second MOS resistor coupled in parallel with one or more of the second plurality of resistors, wherein the second MOS resistor provides different levels of resistance to different process corners.

6. The amplifier of claim 5, wherein the second MOS resistor comprises:
   a first transistor, wherein a gate terminal of the first transistor is coupled to a voltage supply, a source terminal of the first transistor is coupled to a first node coupled to a first end of the one or more of the second plurality of resistors, and a drain terminal of the first transistor is coupled to a second node coupled to a second end of the one or more of the second plurality of resistors; and
   a second transistor, wherein a gate terminal of the second transistor is coupled to ground, a source terminal of the second transistor is coupled to the second node, and a drain terminal of the second transistor is coupled to the first node.

7. The amplifier of claim 1, comprising a pair of input transistors coupled to respective inputs at a respective gate terminal of each of the pair of input transistors, wherein respective terminals of the pair of input transistors couple to the respective terminals of the two transistors.

8. The amplifier of claim 7, comprising biasing circuitry coupled to additional terminals of the pair of input transistors, wherein the biasing circuitry is configured to provide a biasing voltage to the pair of input transistors.

9. The amplifier of claim 1, comprising an oversaturated transconductance amplifier.

10. A semiconductor device, comprising:
    a pair of transistors, wherein a respective gate terminal of each of the pair of transistors is coupled together to a common connection; and
    a local common mode feedback resistor coupled between the common connection and respective terminals of the pair of transistors, wherein the local common mode feedback resistor comprises:
       a plurality of resistors coupled in series between the respective terminals of the pair of transistors;
       a first metal oxide semiconductor (MOS) resistor coupled in parallel with a first portion of the plurality of resistors; and
       a second MOS resistor coupled in parallel with a second portion of the plurality of resistors.

11. The semiconductor device of claim 10, wherein the respective terminals of the pair of transistors comprise respective drain terminals of the pair of transistors.

12. The semiconductor device of claim 10, wherein the local common mode feedback resistor is configured to provide less resistance for fast process corners than slower process corners by providing less resistance through the first MOS resistor than through the first portion, less resistance through the second MOS resistor than through the second portion, or a combination thereof to enable bypassing the first portion of the plurality of resistors, the second portion of the plurality of resistors, or a combination thereof.

13. The semiconductor device of claim 10, wherein the local common mode feedback resistor is configured to provide more resistance for fast process corners than slower process corners by providing more resistance through the first MOS resistor than through the first portion of the plurality of resistors directing current through the first portion of the plurality of resistors.

14. The semiconductor device of claim 10, wherein the local common mode feedback resistor is configured to provide more resistance for fast process corners than slower process corners by providing more resistance through the second MOS resistor than through the second portion of the plurality of resistors directing current through the second portion of the plurality of resistors.

15. The semiconductor device of claim 10, wherein the first MOS resistor comprises a first transistor and a second transistor, wherein the first transistor comprises a first source terminal coupled to a first end of the first portion, a first gate terminal coupled to a voltage supply, and a first drain terminal coupled to a second end of the first portion, and wherein the second transistor comprises a second source terminal coupled to the second end, a second gate terminal coupled to ground, and a second drain terminal coupled to the first end of the first portion.

16. The semiconductor device of claim 15, wherein the first transistor comprises an n-channel MOS transistor, and the second transistor comprises a p-channel MOS transistor.

17. The semiconductor device of claim 15, wherein the second MOS resistor comprises a third transistor and a fourth transistor, wherein the third transistor comprises a third source terminal coupled to a first end of the second portion, a third gate terminal coupled to the voltage supply, and a third drain terminal coupled to a second end of the second portion, and wherein the fourth transistor comprises a fourth source terminal coupled to the second end of the second portion, a fourth gate terminal coupled to ground, and a fourth drain terminal coupled to the first end of the second portion.

18. The semiconductor device of claim 17, wherein the third transistor comprises an n-channel MOS transistor, and the fourth transistor comprises a p-channel MOS transistor.

19. A local common mode feedback resistor, comprising:
a first terminal;
a second terminal;
a third terminal;
a plurality of resistors coupled in series between the first and second terminals, wherein the third terminal is located among the plurality of resistors;
a first metal oxide semiconductor (MOS) resistor coupled in parallel with a first portion of the plurality of resistors, wherein the first MOS resistor comprises a first transistor and a second transistor; and
a second MOS resistor coupled in parallel with a second portion of the plurality of resistors, wherein the second MOS resistor comprises a third transistor and a fourth transistor, wherein the local common mode feedback resistor, via the first and second MOS resistors, is configured to cause an amount of gain to be based at least in part on a process corner by providing more gain for slower process corners than for faster process corners.

20. The local common mode feedback resistor of claim 19, wherein each of the plurality of resistors comprises a same resistance value.

21. The local common mode feedback resistor of claim 19, wherein the first transistor comprises a first NMOS transistor comprising:
a first gate terminal coupled to a voltage supply;
a first source terminal coupled to a first node coupled to a first end of the first portion of the plurality of resistors; and
a first drain terminal coupled to a second node coupled to a second end of the first portion of the plurality of resistors.

22. The local common mode feedback resistor of claim 21, wherein the second transistor comprises a first PMOS transistor comprising:
a second gate terminal coupled to ground;
a second drain terminal coupled to the first node; and
a second source terminal coupled to the second node.

23. The local common mode feedback resistor of claim 22, wherein the third transistor comprises a second NMOS transistor comprising:
a third gate terminal coupled to a voltage supply;
a third source terminal coupled to a third node coupled to a first end of the second portion of the plurality of resistors; and
a third drain terminal coupled to a fourth node coupled to a second end of the second portion of the plurality of resistors.

24. The local common mode feedback resistor of claim 23, wherein the second transistor comprises a second PMOS transistor comprising:
a fourth gate terminal coupled to ground;
a fourth drain terminal coupled to the third node; and
a fourth source terminal coupled to the fourth node.

* * * * *